United States Patent
Seo et al.

(10) Patent No.: US 9,147,465 B2
(45) Date of Patent: Sep. 29, 2015

(54) CIRCUIT FOR CONTROLLING SENSE AMPLIFIER SOURCE NODE IN SEMICONDUCTOR MEMORY DEVICE AND CONTROLLING METHOD THEREOF

(71) Applicant: Samsung Electronics Co., Ltd., Suwon-si, Gyeonggi-do (KR)

(72) Inventors: Young-Hun Seo, Hwaseong-si (KR); Chul-Sung Park, Seoul (KR); Young-Dae Lee, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 95 days.

(21) Appl. No.: 14/139,736

(22) Filed: Dec. 23, 2013

(65) Prior Publication Data
US 2014/0198596 A1    Jul. 17, 2014

Related U.S. Application Data

(60) Provisional application No. 61/753,475, filed on Jan. 17, 2013.

(30) Foreign Application Priority Data

Apr. 22, 2013  (KR) .......................... 10-2013-0044325

(51) Int. Cl.
*G11C 11/4091*    (2006.01)
(52) U.S. Cl.
CPC .................................. *G11C 11/4091* (2013.01)
(58) Field of Classification Search
CPC .................................................. G11C 11/4091

USPC .......................................................... 365/207
See application file for complete search history.

(56) References Cited

U.S. PATENT DOCUMENTS

| | | | |
|---|---|---|---|
| 6,337,824 B1 | 1/2002 | Kono et al. | |
| 6,535,443 B1 * | 3/2003 | OuYang et al. | 365/207 |
| 6,570,797 B1 | 5/2003 | Chih | |
| 7,466,616 B2 * | 12/2008 | Byun et al. | 365/208 |
| 7,929,367 B2 | 4/2011 | Yoo et al. | |
| 8,395,953 B2 * | 3/2013 | Kim et al. | 365/203 |
| 2011/0122711 A1 * | 5/2011 | Kim et al. | 365/189.09 |

OTHER PUBLICATIONS

Mikio Asakura et al. / An Experimental 256-Mb DRAM with Boosted Sense-Ground Scheme / IEEE, Nov. 1994 / vol. 29, No. 11 / 7 pages (1303-1309).

* cited by examiner

*Primary Examiner* — Min Huang
(74) *Attorney, Agent, or Firm* — Muir Patent Law, PLLC

(57) ABSTRACT

Provided is a bit line sense amplifier source node control circuit of a semiconductor memory device. The sense amplifier source node control circuit may include a source driver connected between a source node of a sense amplifier and a sense amplifier driving signal line, for driving the source node of the sense amplifier to a set voltage level. The sense amplifier source node control circuit may also include: a floating circuit for floating the sense amplifier driving signal line in a set operating mode; and a controller connected in parallel with the source driver between the source node of the sense amplifier and the sense amplifier driving signal line, for controlling a level of the sense amplifier driving signal line in the set operating mode.

19 Claims, 19 Drawing Sheets

CIRCUIT FOR CONTROLLING SENSE AMPLIFIER SOURCE NODE IN SEMICONDUCTOR MEMORY DEVICE AND CONTROLLING METHOD THEREOF

CROSS-REFERENCE TO RELATED APPLICATIONS

This U.S. non-provisional patent application claims priority under 35 U.S.C. §119 to U.S. provisional application No. 61/753,475 filed on Jan. 17, 2013 and to Korean Patent Application No. 10-2013-0044325 filed on Apr. 22, 2013, the entire contents of which are hereby incorporated by references.

BACKGROUND

The present disclosure herein relates to a semiconductor memory device, and more particularly, to the controlling of a sense amplifier source node in a semiconductor memory device such as a dynamic random access memory.

Semiconductor memory devices such as dynamic random access memories (hereinafter referred to as "DRAMs") have been widely used as main memories in electronic systems including computers and portable electronic devices.

A DRAM, almost by necessity, includes a bit line sense amplifier that detects and amplifies data stored in a memory cell.

The active operation of a DRAM, for example, a read operation mode or a write operation mode inevitably consumes a power for accessing data. In the case where data access is not performed, for example, in an operation that is not active, a DRAM may have a power down mode for minimally consuming driving current. In order to further reduce power consumption, a DRAM may receive a power down command from a controller even during active operation, which is commonly referred to as an active power down command.

However, even in the case of an active power down mode, leakage current may continue to flow to a bit line sense amplifier. Thus, power is still consumed.

SUMMARY

The present disclosure provides a sense amplifier source node controlling circuit that may minimize or reduce leakage current at a sense amplifier, and a method for controlling a sense amplifier source node according to the same.

Embodiments of the disclosure provide a circuit for controlling a sense amplifier source node of a semiconductor memory device, the circuit include: a source driver connected between a source node of a sense amplifier and a sense amplifier driving signal line, for driving the source node of the sense amplifier to a set voltage level; a floating circuit for floating the sense amplifier driving signal line in a set operating mode; and a controller connected in parallel with the source driver between the source node of the sense amplifier and the sense amplifier driving signal line, for controlling a level of the sense amplifier driving signal line in the set operating mode.

In some embodiments, the controller may include: a voltage level amplifying circuit having a first input terminal, and a second input terminal to which a reference voltage is applied; a first switch for switching between the first input terminal and the source node of the sense amplifier in the set operating mode; and a second switch for switching between an output terminal of the voltage level amplifying circuit and the sense amplifier driving signal line in the set operating mode.

In other embodiments, the sense amplifier may be a bit line sense amplifier including n-type MOS (NMOS) transistors.

In still other embodiments, the set operating mode may be an operating mode other than an active mode of the semiconductor memory device.

In even other embodiments, the source driver may include at least one NMOS transistor of which a drain is connected to the source node of the sense amplifier, a gate is connected to the sense amplifier driving signal line, and a source is connected to ground.

In yet other embodiments, the first and second switches may be MOS transistors that are switched "on" in the set operating mode and switched "off" in an operating mode other than the set operating mode.

In further embodiments, the floating circuit may be a tri-state buffer for applying a sense amplifier enable signal to the sense amplifier driving signal line in an active mode of the semiconductor memory device.

In still further embodiments, the voltage level amplifying circuit may include a differential amplifier for driving the source node of the sense amplifier to a level of the reference voltage in the set operating mode.

In even further embodiments, the voltage level amplifying circuit may be shared by one or more memory banks of the semiconductor memory device.

In yet further embodiments, the circuit may further include an amplifying circuit connected between the voltage level amplifying circuit and the source node of the sense amplifier, for driving the source node of the sense amplifier at a level of the reference voltage or higher.

In other embodiments of the disclosure, a semiconductor memory device including a sense amplifier is provided. The semiconductor memory device includes a source driver connected between a source node of the sense amplifier and a sense amplifier driving signal line, and configured to control a voltage level of the source node of the sense amplifier; a buffer circuit configured to float the sense amplifier driving signal line in a first operation mode of the semiconductor memory device; and a control circuit connected in parallel with the source driver between the source node of the sense amplifier and the sense amplifier driving signal line, and configured to control a voltage level of the sense amplifier driving signal line in the first operation mode.

In some embodiments, the control circuit may include a voltage level amplifying circuit having a first input terminal, and a second input terminal to which a reference voltage is applied; a first switch configured to connect the first input terminal to the source node of the sense amplifier in the first operation mode; and a second switch configured to connect an output terminal of the voltage level amplifying circuit to the sense amplifier driving signal line in the first operation mode.

In other embodiments, the sense amplifier may be a bit line sense amplifier including n-type MOS (NMOS) transistors.

In still other embodiments, the first operation mode may be an operating mode other than an active mode of the semiconductor memory device.

In even other embodiments, the source driver may include at least one NMOS transistor of which a drain is connected to the source node of the sense amplifier, a gate is connected to the sense amplifier driving signal line, and a source is connected to a ground voltage.

In yet other embodiments, the first and second switches may be MOS transistors that are switched "on" in the first operation mode and switched "off" in an operating mode other than the first operation mode.

In further embodiments, the buffer circuit may be a tri-state buffer configured to apply a sense amplifier enable signal to the sense amplifier driving signal line in an active mode of the semiconductor memory device.

In still further embodiments, the voltage level amplifying circuit may include a differential amplifier configured to maintain the source node of the sense amplifier at a level of the reference voltage in the first operation mode.

In even further embodiments, the voltage level amplifying circuit is configured to may be shared by one or more memory banks of the semiconductor memory device.

In yet further embodiments, the semiconductor memory device may further include an amplifying circuit connected between the voltage level amplifying circuit and the source node of the sense amplifier, and configured to maintain the source node of the sense amplifier at a level of the reference voltage.

In still other embodiments of the disclosure, a semiconductor memory device is provided. The semiconductor memory device includes a sense amplifier connected between a first bit line and a second bit line, and configured to amplify a voltage difference between a first bit line and a second bit line during a first operation mode of the semiconductor memory device; a source driver connected between a source node of the sense amplifier and a sense amplifier driving signal line, and configured to provide a first voltage to the source node of the sense amplifier during the first operation mode; a control circuit connected in parallel with the source driver between the source node of the sense amplifier and the sense amplifier driving signal line, and configured to control a voltage level of the sense amplifier driving signal line in response to a voltage level of the source node of the sense amplifier during a second operation mode of the semiconductor memory device different from the first operation mode; and a buffer circuit configured to float the sense amplifier driving signal line during the second operation mode of the semiconductor memory device.

In still other embodiments of the disclosure, a method of operating a semiconductor memory device having a sense amplifier connected to a first bit line and a second bit line, and a source driver connected to a source node of the sense amplifier, the method includes activating a buffer circuit to provide a first driver control signal having a first voltage level to the source driver from an output node of the buffer circuit; activating the source driver in response to the first driver control signal, such that the sense amplifier is activated; and floating the output node of the buffer circuit and providing a second driver control signal having a second voltage level different from the first voltage level to the output node of the buffer circuit. The second voltage level is responsive to a voltage level of the source node of the sense amplifier.

According to embodiments of the present disclosure, power consumption due to leakage current of a sense amplifier in an operating mode such as an active power down mode may be minimized or reduced.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain principles of the disclosure. In the drawings.

DETAILED DESCRIPTION OF THE EMBODIMENTS

Figure 1:
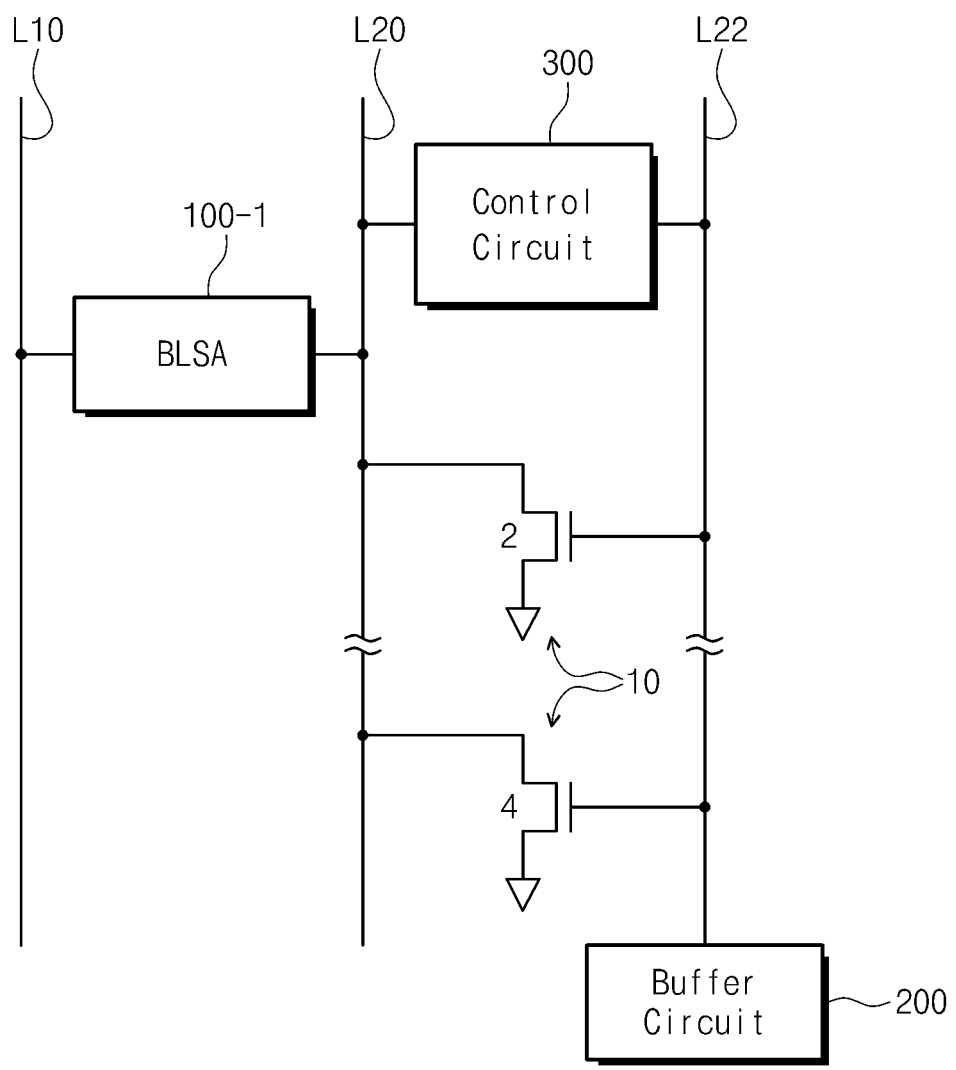
FIG. 1 is an exemplary block diagram of a sense amplifier source node control circuit of a semiconductor memory device according to some embodiments.

Exemplary embodiments of the present disclosure will be described more fully below with reference to the accompanying drawings. However, embodiments of the present disclosure are not limited to embodiments described herein and may be specified in different forms. Like reference numerals may refer to like elements throughout the accompanying drawings.

It will be understood that, although the terms "first", "second", "third", etc., may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

It will be understood that when an element or layer is referred to as being "on", "connected to", "coupled to", or "adjacent to" another element or layer, it can be directly on, connected, coupled, or adjacent to the other element or layer, or intervening elements or layers may be present.

Each embodiment described and exemplified here may include embodiments complementary thereto, and is will be noted that the basic data accessing operation and refresh operation of a semiconductor memory device such as a DRAM and details on internal functional circuits will not be described so as not to obscure embodiments of the present disclosure.

Hereinafter, exemplary embodiments of the disclosure will be described in detail with reference to the accompanying drawings.

FIG. 1 is an exemplary block diagram of a sense amplifier source node control circuit of a semiconductor memory device according to some embodiments.

Referring to FIG. 1, a bit line sense amplifier 100-1 is connected between a first line L10 and a second line L20. The bit line sense amplifier 100-1 may include a p-type sense amplifier formed of p-type MOS (PMOS) transistors and an n-type sense amplifier formed of n-type MOS (NMOS) transistors. The second line L20 is connected to the NMOS transistors configuring the n-type sense amplifier, and includes a sense amplifier source node. For example, the sense amplifier source node is connected to the second line L20.

The first line L10 is connected to a drain of the PMOS transistors configuring the p-type sense amplifier, and includes a sense amplifier drain node.

A source driver 10 has a drain connected to the sense amplifier source node and a gate connected to a sense amplifier driving signal line, and may include one or more NMOS transistors 2 and 4 having a source connected to ground.

The source driver 10 is connected between the sense amplifier source node L20 and the sense amplifier driving signal line L22, and controls a voltage level of the sense amplifier source node L20.

A buffer circuit 200 floats the sense amplifier driving signal line L22 in an operating mode such as an active power down mode. The buffer circuit 200 applies a sense amplifier enable signal to the sense amplifier driving signal line L22 in an active operating mode that is not the active power down mode. As a result, the buffer circuit 200 may be implemented as a tri-state buffer that is turned on or off in operation according to an enable signal.

A control circuit 300 is parallelly connected to the source driver 10 between the sense amplifier source node L20 and the sense amplifier driving signal line L22. The control circuit 300 controls a voltage level of the sense amplifier driving signal line L22 in the active power down mode, and maintains the voltage of the sense amplifier source node L20 at a certain level.

When the control circuit 300 functions as a switch that performs only switching, the control circuit 300 may be referred to as a switching circuit. For example, the control circuit 300, by being switched in an operating mode (e.g., an active power down mode), may make the source driver 10 a diode connection structure. The control circuit 300 will be described in detail with reference to FIGS. 2 and 3.

Figure 2:
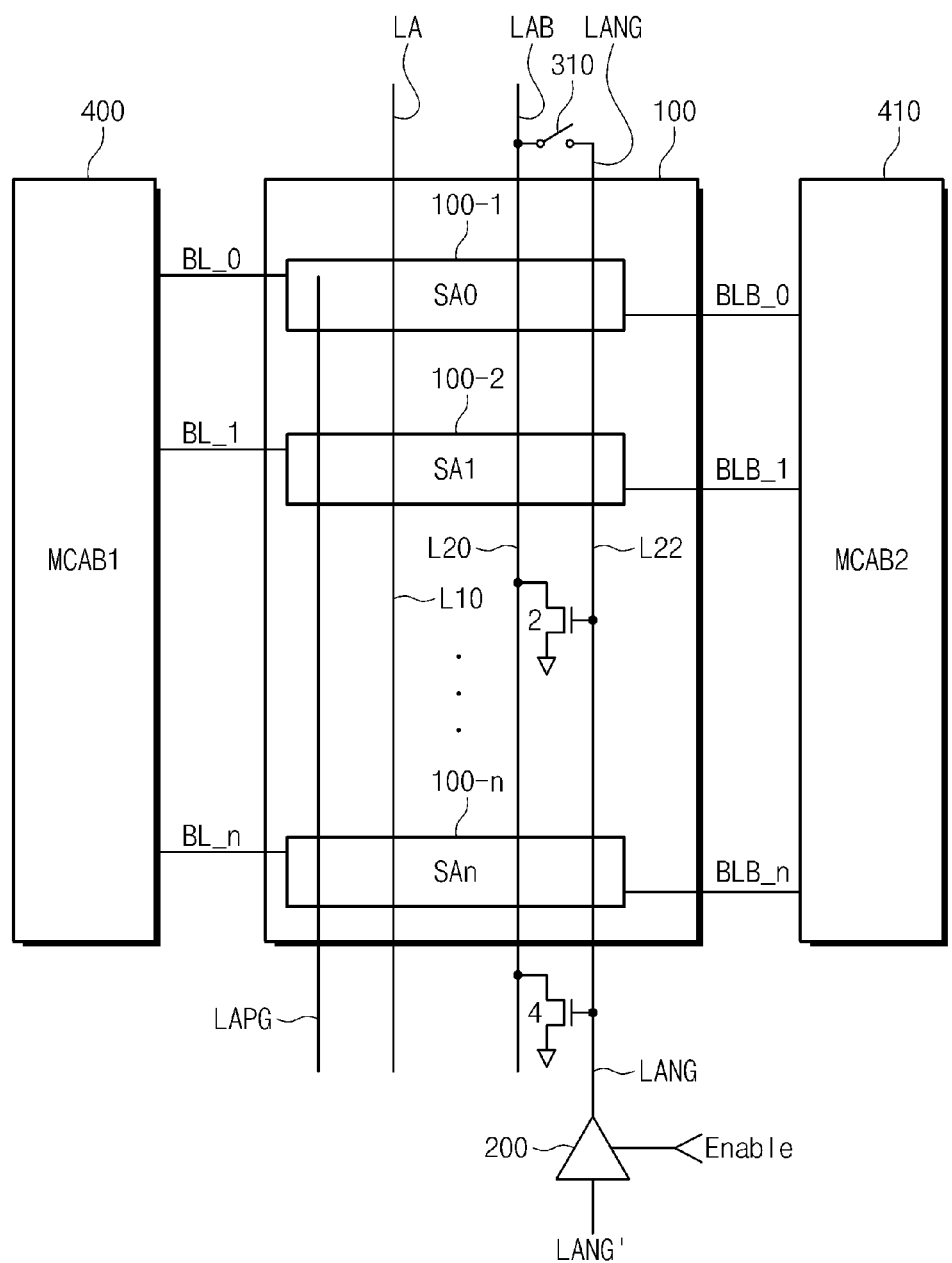
FIG. 2 is an exemplary block diagram illustrating a semiconductor memory device of FIG. 1 according to one embodiment.

FIG. 2 is an exemplary block diagram illustrating a semiconductor memory device of FIG. 1 according to one embodiment.

Referring to FIG. 2, a bit line sense amplifier circuit block 100 is connected between first and second memory cell array blocks 400 and 410. The bit line sense amplifier circuit block 100 includes a plurality of bit line sense amplifiers 100-1, 100-2, ..., and 100-n. An arbitrary bit line sense amplifier SAO may have the same structure as the bit line sense amplifier 100-1 of FIG. 1. The bit line sense amplifier SAO 100-1 is connected to a bit line BL_0 and a complementary bit line BLB_0 and performs the operation of detecting and amplifying a bit line voltage.

In FIG. 2, LA may correspond to the first line L10 of FIG. 1, and LAB may correspond to the second line L20 of FIG. 1. Also, LANG may correspond to the sense amplifier driving signal line L22 of FIG. 1. As a result, LAB is an n-type sense amplifier source node.

NMOS transistors 2 and 4 configure the source driver 10 of FIG. 1.

A tri-state buffer 200 corresponds to the buffer circuit 200 of FIG. 1.

A switch 310 configures the control circuit 300 of FIG. 1. The switch 310, by being switched in the operating mode (e.g., an active power down mode), may make the source driver 10 a diode connection structure. For example, by being switched, the switch 310 electrically connects the gate and the drain of the NMOS transistor 2. Thus, the NMOS transistor functions as a diode.

Figure 3:
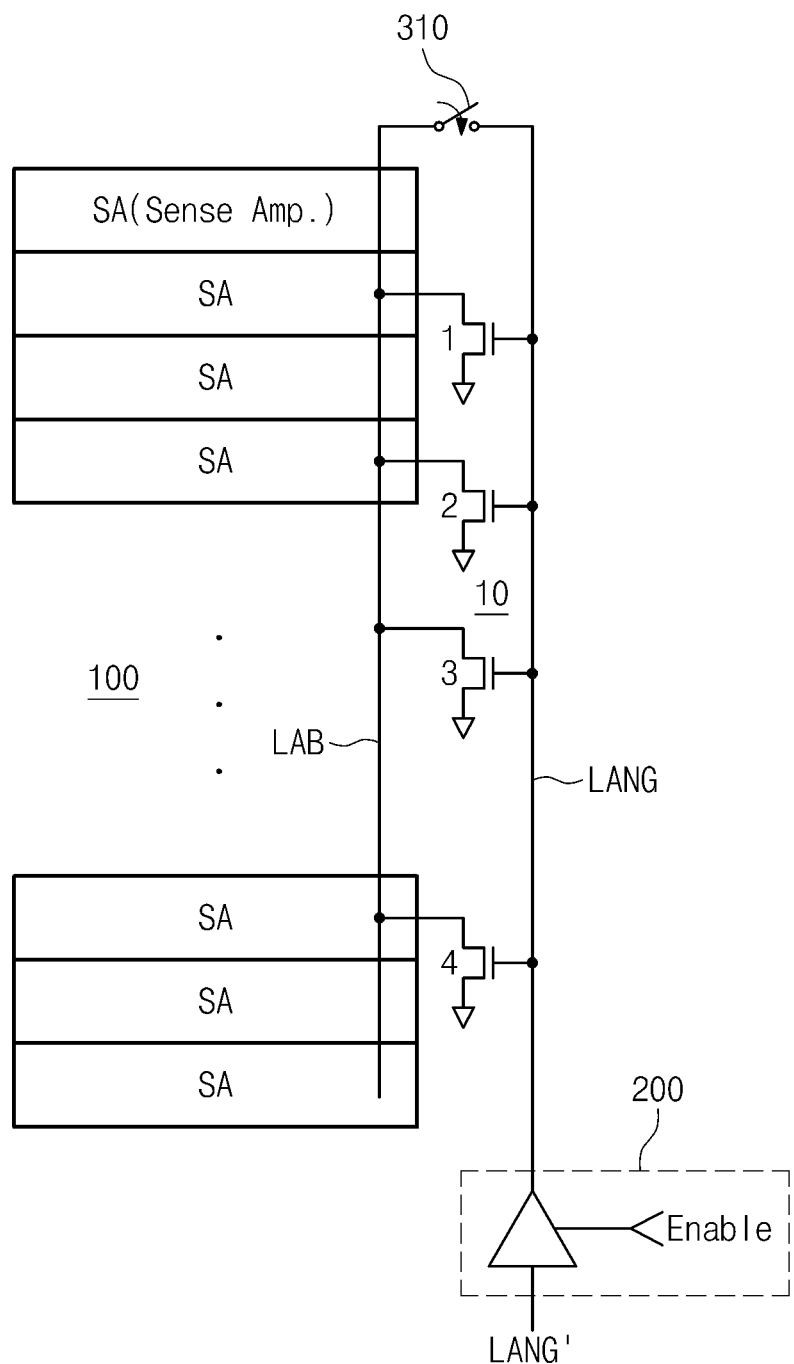
FIG. 3 is an exemplary diagram illustrating a part of FIG. 2 according to one embodiment.
Figure 4:
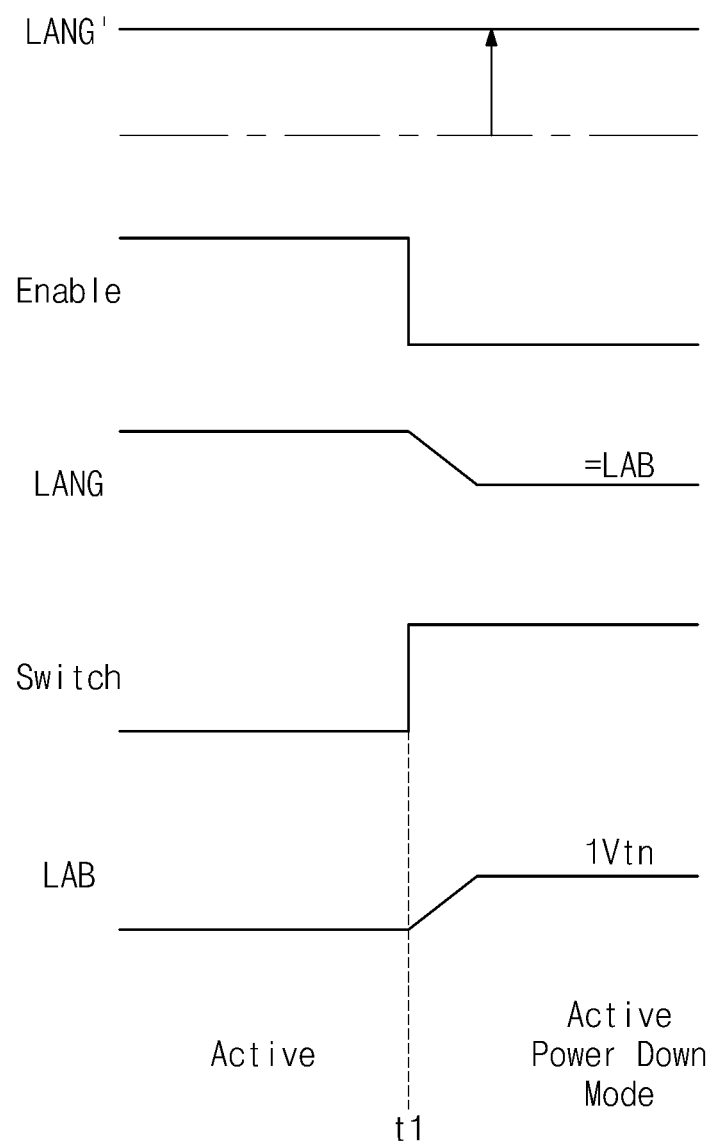
FIG. 4 is an exemplary timing diagram illustrating an operation of FIG. 3 according to certain embodiments.

FIG. 3 is an exemplary diagram illustrating a part of FIG. 2 according to one embodiment. Also, FIG. 4 is an exemplary timing diagram illustrating an operation of FIG. 3 according to certain embodiments.

Referring to FIG. 3, in an active power down mode, the tri-state buffer 200 responds to an enable signal and performs a floating function, and the switch 310 is turned on. Accordingly, the sense amplifier driving signal line LANG is unable to receive a driving voltage LANG' and is floated. Also, due to the switching operation of the switch 310, the source driver 10 is given a diode connection structure. Thus, the voltage level of the sense amplifier source node LAB may begin to rise at the point t1 illustrated in FIG. 4. The rise in the voltage level may continue until the difference between the voltage level of the source node LAB and the voltage level of the sense amplifier driving signal line LANG reaches a threshold voltage of the NMOS transistor 2 that is a diode connection. As a result, when the voltage level difference between the LAB and the LANG reaches the threshold voltage of the diode, the rise in voltage level of the LAB ceases.

Accordingly, in an active power down mode, leakage current that flows from the bit line sense amplifier source node to ground is minimized or reduced.

Thus, while the circuit configuration of FIG. 3 uses a buffer circuit and a switching circuit, by using the source driver 10 that is a LAB driver as a source node controlling device, there is little burden for chip layout.

Figure 5:
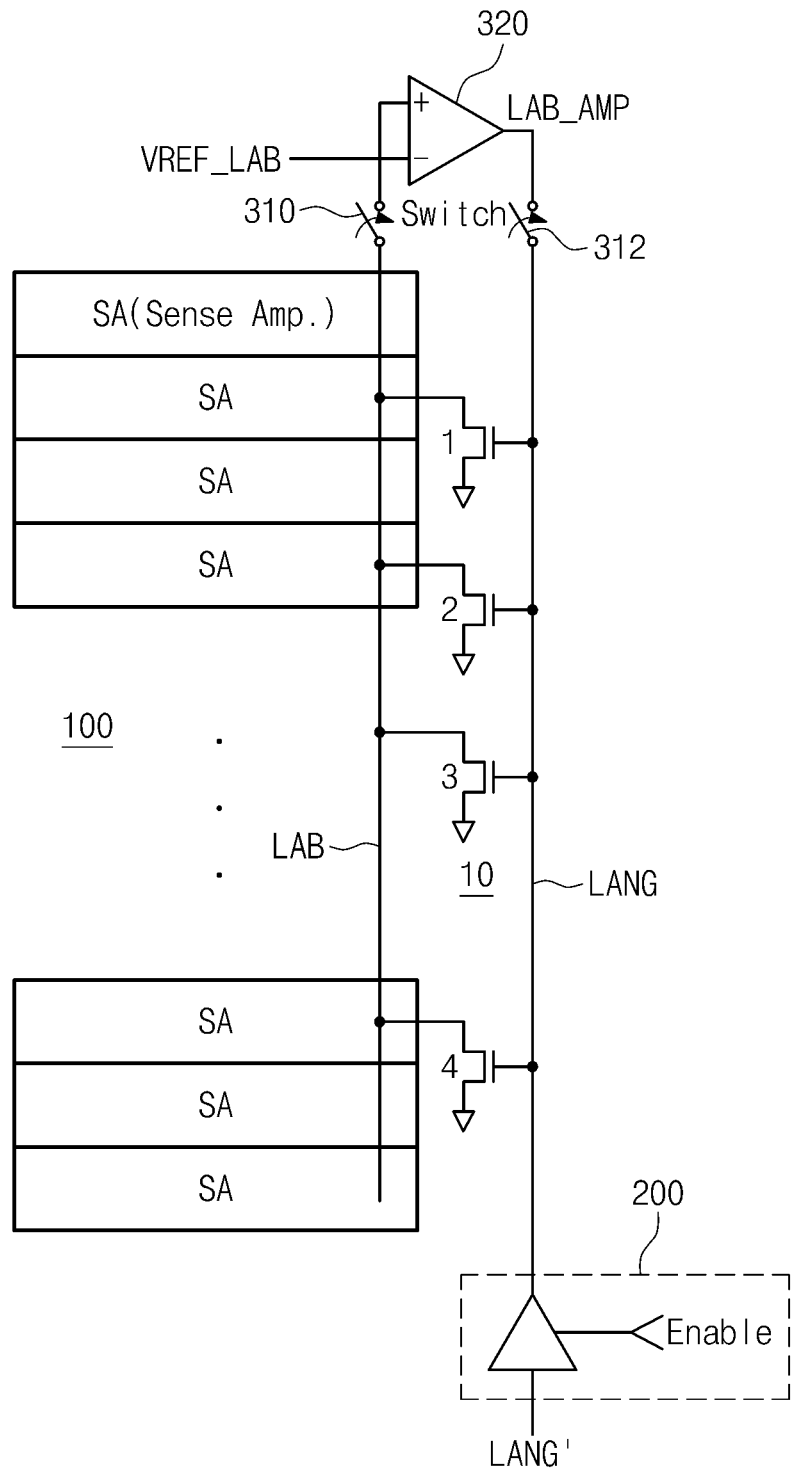
FIG. 5 is a diagram illustrating a semiconductor memory device of FIG. 1 according to an exemplary embodiment.

FIG. 5 is a diagram illustrating a semiconductor memory device of FIG. 1 according to an exemplary embodiment. Also, FIG. 6 is an exemplary timing diagram illustrating an operation of FIG. 5 according to certain embodiments.

Referring to FIG. 5, a voltage level amplifying circuit 320 and a first and a second switch 310 and 312 configure the control circuit 300 of FIG. 1. For example, the control circuit 300 may include the voltage level amplifying circuit 320 that has a first input terminal (+) to which the source node LAB is connected and a second input terminal (−) to which a reference voltage VREF_LAB is applied. Also, the control circuit 300 may include a first switch 310 that switches between the first input terminal (+) of the voltage level amplifying circuit 320 and the source node LAB, and a second switch 312 that switches between an output terminal of the voltage level amplifying circuit 320 and the sense amplifier driving signal line LANG in the active power down mode.

Figure 6:
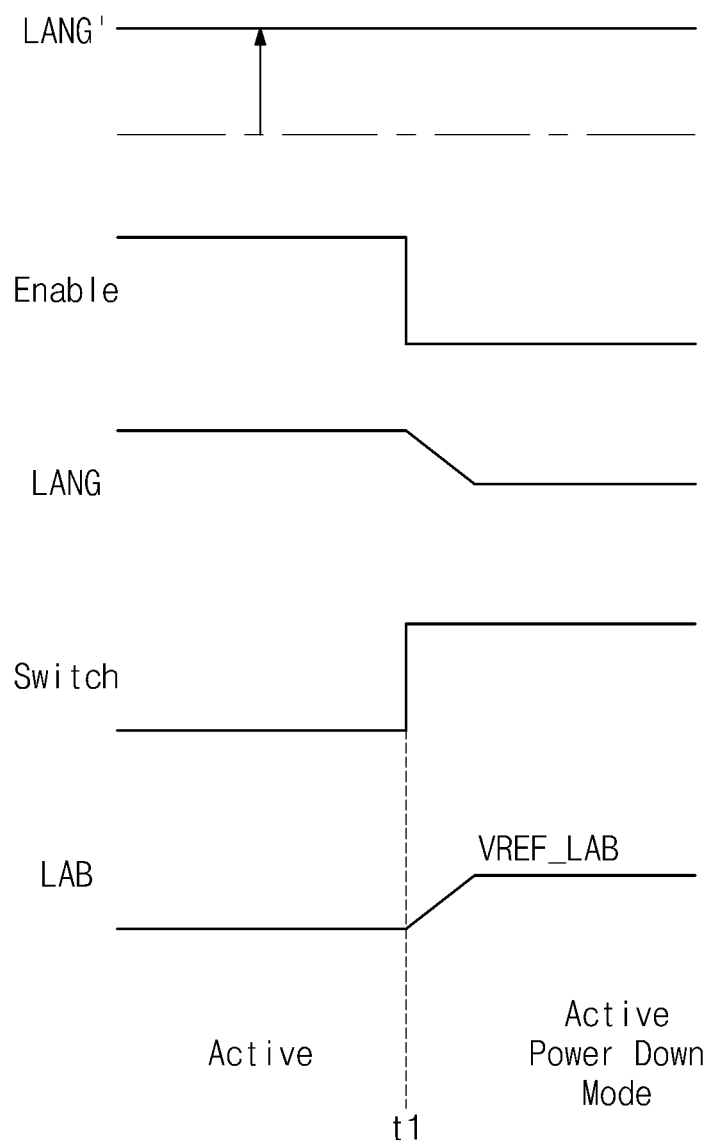
FIG. 6 is an exemplary timing diagram illustrating an operation of FIG. 5 according to certain embodiments.

When an active power down command for ordering a power down during an active operation is applied to the DRAM at point t1 in FIG. 6, the tri-state buffer 200 responds to an enable signal applied, for example, at a low level and performs a floating function. Also, the first and second switches 310 and 312 respond to a switching control signal applied, for example, at a high level and are switched to turn on. Thus, the sense amplifier driving signal line LANG no longer receive the driving voltage LANG' and is floated. Also, the voltage level amplifying circuit 320 is operably connected between the LAB and the LANG by means of the switching operation of the first and second switches 310 and 312.

Accordingly, a voltage level of the sense amplifier source node LAB may begin to rise at point t1 as illustrated in FIG. 6. The rise in the voltage level may continue until the voltage level of the source node LAB reaches the reference voltage VREF_LAB. Ultimately, when the voltage level of the LAB reaches the reference voltage VREF_LAB, the rise in the voltage level of the LAB ceases by the voltage level of the sense amplifier driving signal line LANG. In this case, unlike in FIG. 3, when the reference voltage VREF_LAB is suitably set as a control target voltage level, the voltage level of the LAB may be controlled to a desired level.

Accordingly, in an active power down mode, leakage voltage that flows from a source node of a bit line sense amplifier to ground is minimized or reduced.

In the circuit configuration in FIG. 5, the controlling of the source node of the bit line sense amplifier is performed to a desired voltage level through the use of the voltage level amplifying circuit 320.

Figure 7:
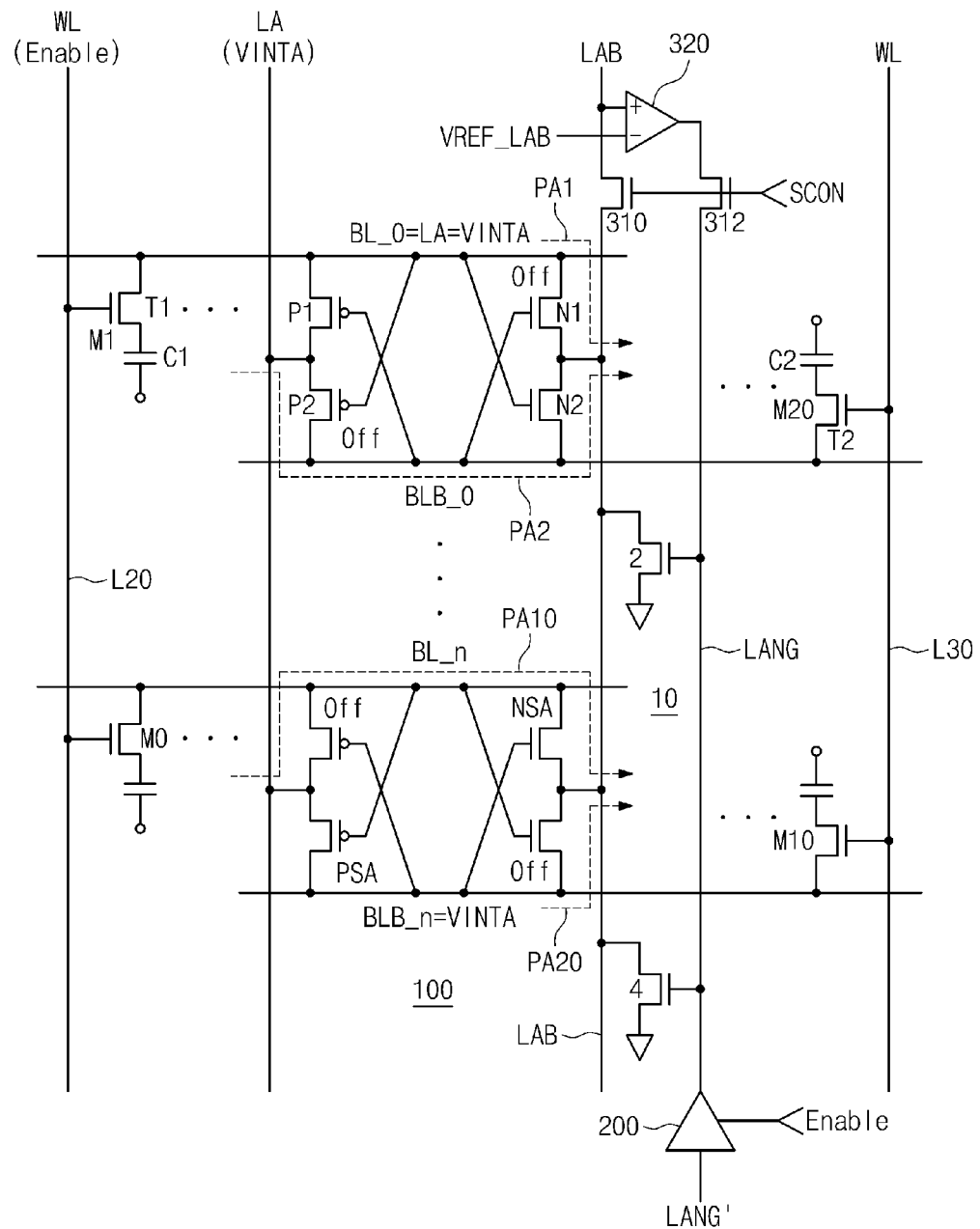
FIG. 7 is an exemplary circuit diagram illustrating a semiconductor memory device of FIG. 5 according to one embodiment.

FIG. 7 is an exemplary circuit diagram illustrating a semiconductor memory device of FIG. 5.

Referring to FIG. 7, the first and second switches 310 and 312 in FIG. 5 are formed as NMOS transistors 310 and 312. The NMOS transistors 310 and 312 are driven in response to a switching control signal SCON. The switching control signal SCON is the same as the switching control signal (Switch) in FIG. 6.

The circuit operation in FIG. 7 is the same as the circuit operation in FIG. 5.

In FIG. 7, a more detailed description is provided of an exemplary configuration of the bit line sense amplifier and the connections between memory cells.

The bit line sense amplifier is connected between LA and LAB. Also, the bit line sense amplifier is connected between a bit line BL_0 and a complementary bit line BLB_0. The bit line sense amplifier includes a p-type sense amplifier PSA configured of PMOS transistors P1 and P2, and an n-type sense amplifier NSA configured of NMOS transistors N1 and N2. The LAB is connected to a source of the NMOS transistors N1 and N2 configuring the n-type sense amplifier NSA.

The LA is connected to a drain of the PMOS transistors P1 and P2 configuring the p-type sense amplifier PSA.

When the bit line BL_0 is at an internal power voltage VINTA and the complementary bit line BLB_0 is at a ground level, for example, 0 volt, leakage voltage may flow along current paths PA1 and PA2 in an active operating mode. Accordingly, the leakage current may become a dominant current component in active power down mode.

Therefore, in order to reduce leakage current, the LANG line is floated by the tri-state buffer 200, and the voltage level amplifying circuit 320 is operably connected between the LAB and the LANG. Accordingly, the level of the LAB may be maintained at a desired voltage level VREF_LAB. The voltage level amplifying circuit 320 suitably controls the LANG level such that the LAB level becomes VREF_LAB.

A memory cell M1, configured of one access transistor T1 and one storage capacitor C1, is connected in plurality on a word line WL As shown structure in FIG. 7, one voltage level amplifying circuit 320 is used for each bit line sense amplifier block, and chip size may be increased.

Figure 8:
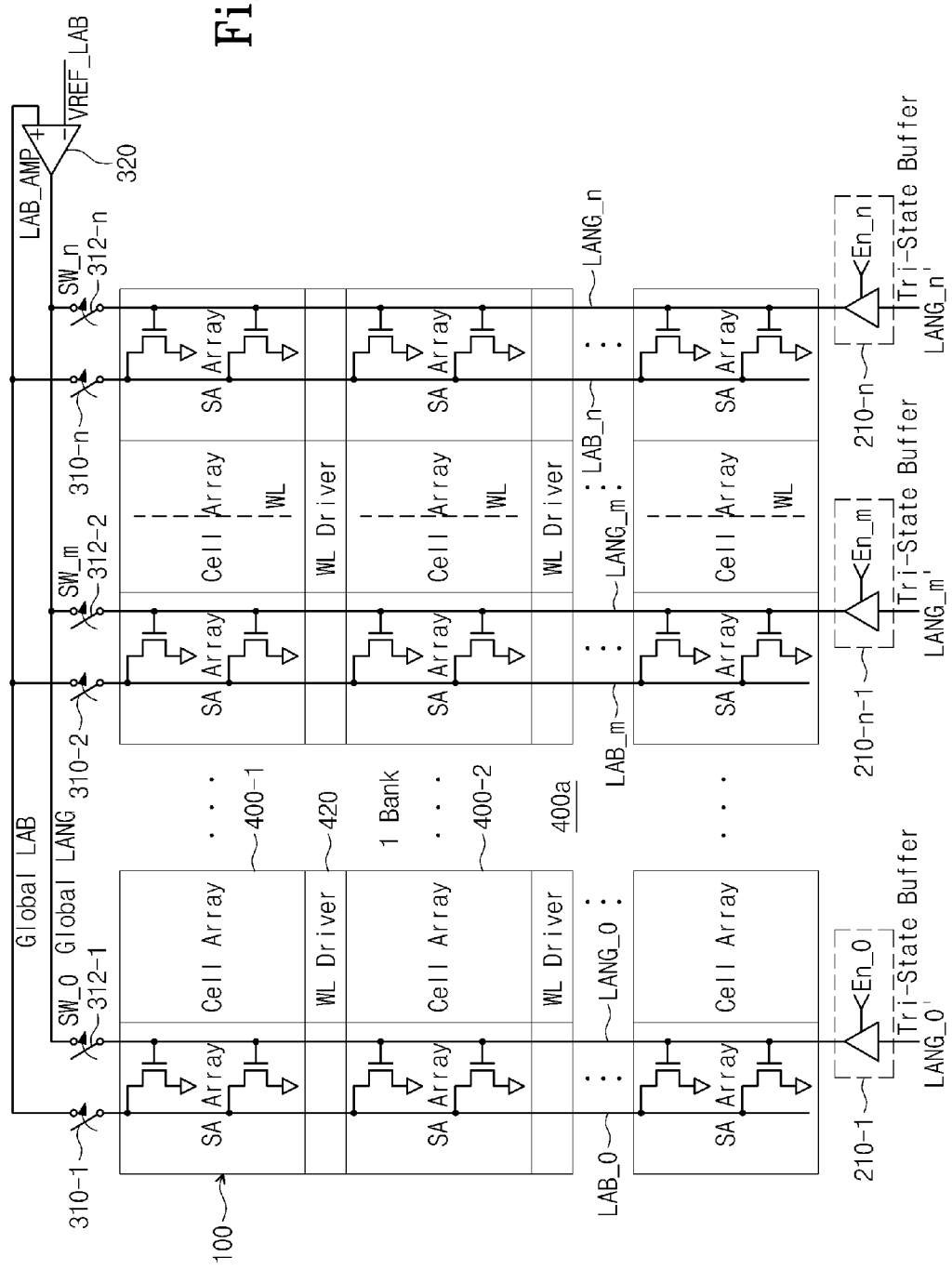
FIG. 8 is an exemplary circuit diagram illustrating an expansion of FIG. 5 according to one embodiment.

FIG. 8 is an exemplary circuit diagram illustrating an expansion of FIG. 5 according to one embodiment.

Referring to FIG. 8, one memory bank 400a includes a plurality of word line drivers 420 and a plurality of memory cell array blocks 100. Each of the memory cell array blocks 100 includes a plurality of memory cell array sub-blocks 400-1, 400-2, . . . , and 400-n. In FIG. 8, one voltage level amplifying circuit 320 is installed on one memory bank 400a. However, a buffer circuit 210-1 and switches 310-1 and 312-1 may be used in one memory block in the memory bank 400a. Also, a buffer circuit 210-n and switches 310-n and 312-n may be used in another memory block.

In an active operating mode, LANG_m and LANG_n are, for example, high, and when an active power down mode is entered in the active operating mode, enable signals En_m and En_n are turned off, and LANG_m and LANG_n are floated. Also, the switches SW_m and SW_n are closed, and two sense amplifier blocks are controlled by the LAB_AMP 320 through a global LAB and a global LANG. In this configuration, only one LAB_AMP 320 is required for every bank. The circuit configuration in FIG. 8 resolves the issue of chip size increasing by sharing one voltage level amplifying circuit 320 in a single memory bank.

Figure 9:
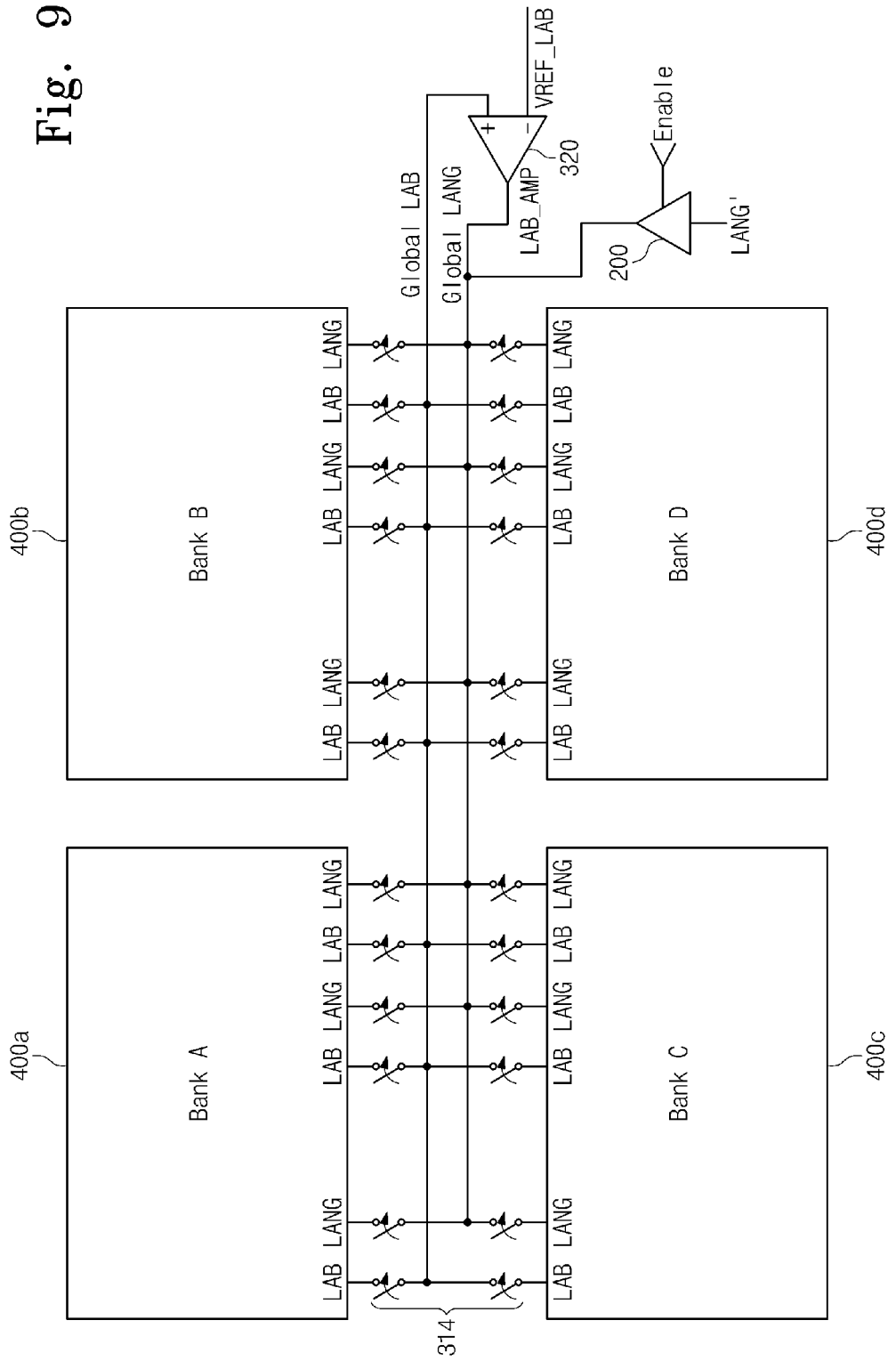
FIG. 9 is another exemplary diagram illustrating another expansion of FIG. 5 according to one embodiment.

FIG. 9 is another exemplary diagram illustrating another expansion of FIG. 5 according to one embodiment.

Referring to FIG. 9, for example, a memory cell array in a DRAM may be configured of four memory banks 400a, 400b, 400c, and 400d.

The circuit configuration in FIG. 9 has one voltage level amplifying circuit 320 and one buffer circuit 200 shared in a plurality of memory banks 400a, 400b, 400c, and 400d. In one embodiment, a switching block 314 includes a plurality of switches that switch between a global LAB and each LAB of each bank and between a global LANG and each LANG of each bank.

In the case of FIG. 9, a chip size may be smaller than that of FIG. 8.

Figure 10:
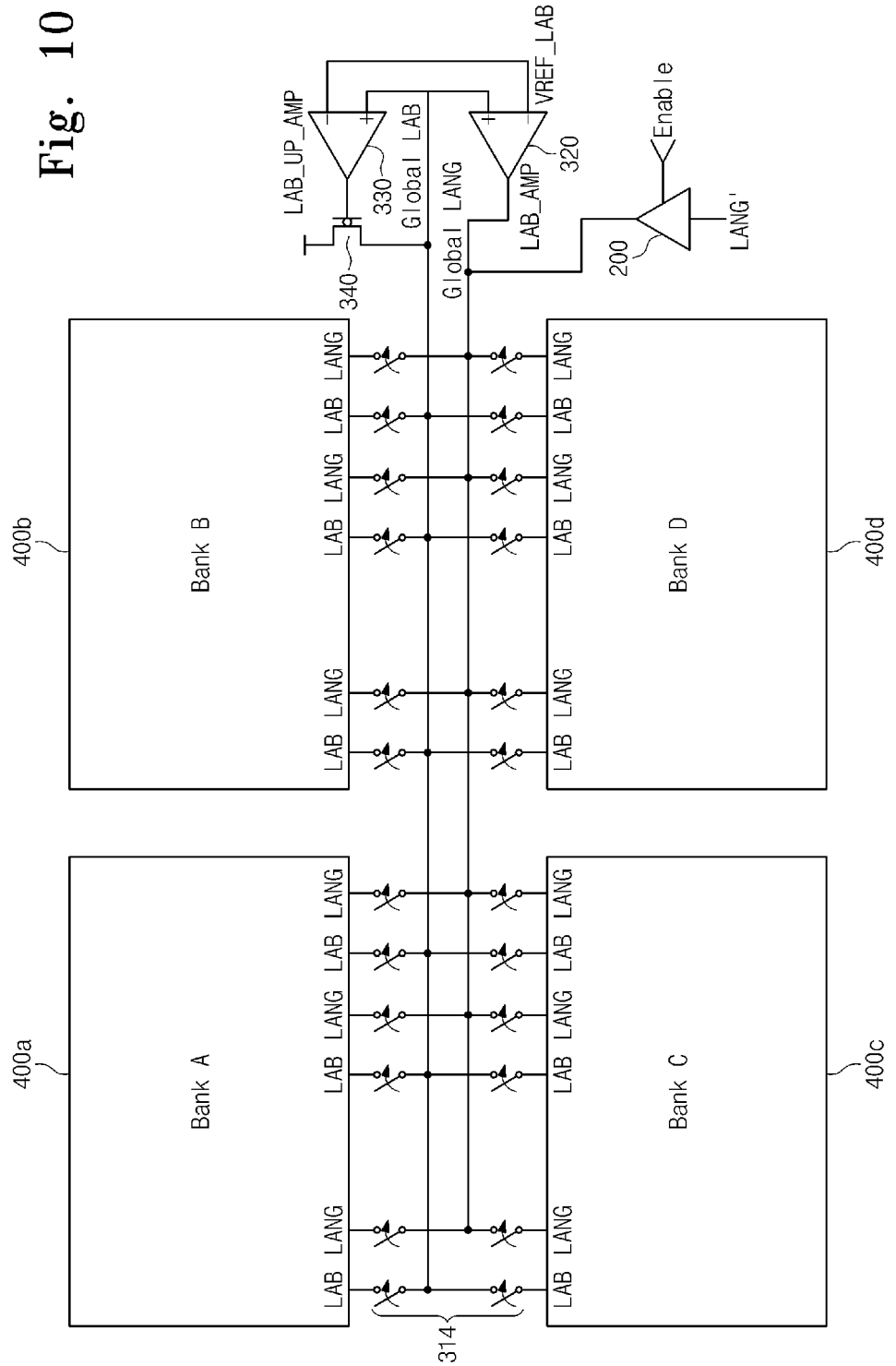
FIG. 10 is an exemplary diagram illustrating a modified embodiment of FIG. 9.

FIG. 10 is an exemplary diagram illustrating a modified embodiment of FIG. 9.

Referring to FIG. 10, in addition to the circuit configuration in FIG. 9, an amplifying circuit 330 for driving the voltage level of the LAB to the reference voltage level, and a pull-up driver 340 for forcibly pulling the voltage level of the LAB to the VREF_LAB are further provided.

During operation, the amplifying circuit 330 may be embodied as an amplifier having an offset for preventing a short circuit between a PMOS transistor 340 and a LAB driver.

Figure 11:
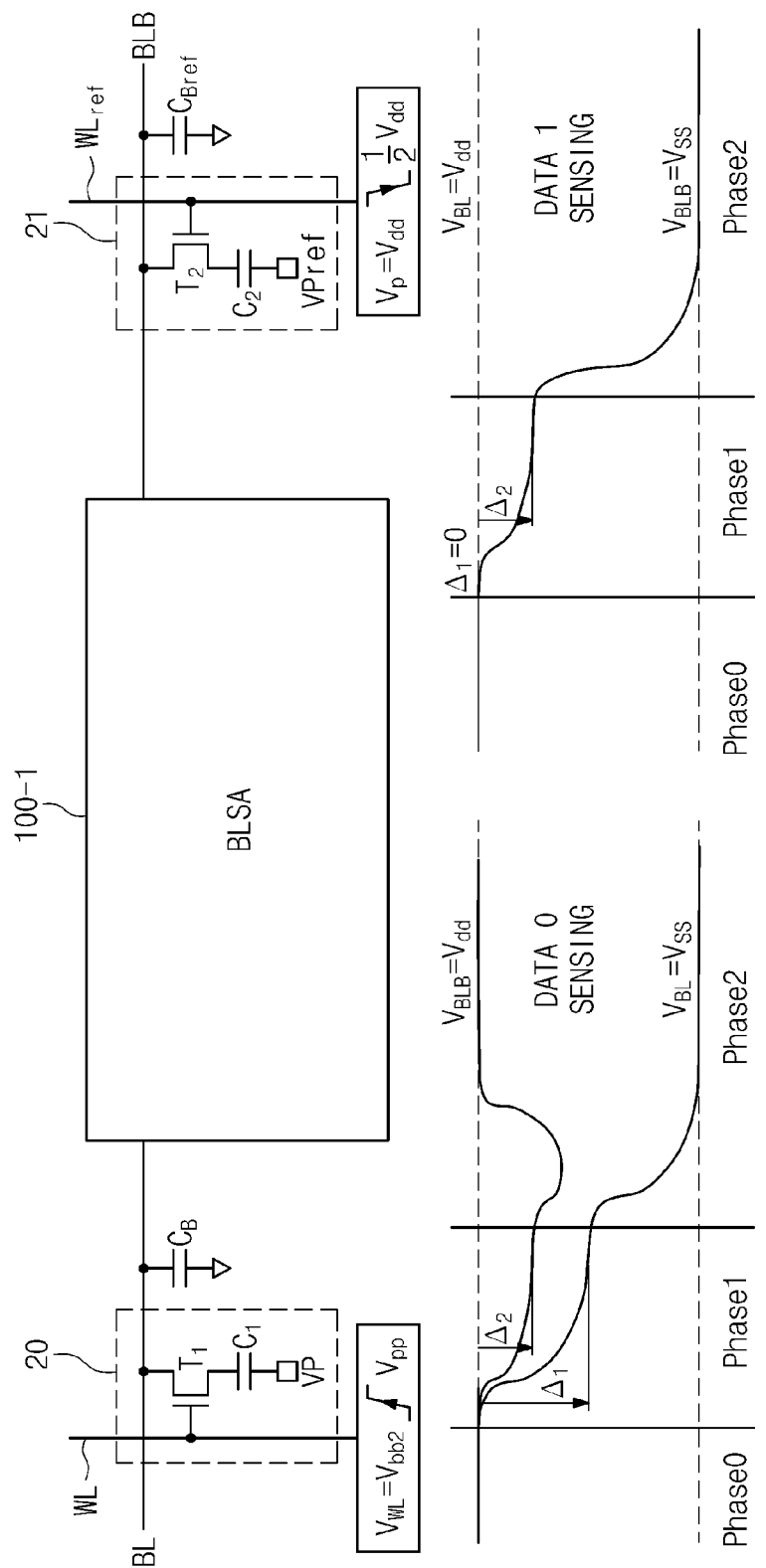
FIG. 11 is an exemplary diagram presented to illustrate the operation of a bit line sense amplifier in FIG. 1.

FIG. 11 is an exemplary diagram presented to illustrate the operation of a bit line sense amplifier of FIG. 1.

A main cell 20 is disposed at an intersecting point of a word line WL and a bit line BL, and a reference cell 21 is disposed at an intersecting point of a reference word line WLref and a complementary bit line BLB.

A bit line sense amplifier 100-1 is connected between the bit line BL and the complementary bit line BLB, and detects and amplifies a "0" and a "1" of data transmitted through the pair of the bit line BL and the complementary bit line BLB.

Here, the main cell 20 connected to the bit line BL and the reference cell 21 connected to the complementary bit line BLB are provided as an example, and at least one reference cell and an additional main cell connected to the bit line BL may be further included, and at least one main cell and an additional reference cell connected to the complementary bit line BLB may be further included.

The main cell 20 includes an access transistor T1 having a gate controlled by the word line WL, a drain connected to the bit line BL, and a source connected to one end of a main capacitor C1. The other end of the main capacitor C1 is connected to a main plate voltage VP.

The reference cell 21 includes an access transistor T2 having a gate controlled by the reference word line WLref, a drain connected to the complementary bit line BLB, and a source connected to one end of a reference capacitor C2. The other end of the reference capacitor C2 is connected to a reference plate voltage VPref.

Referring to FIG. 11, in a first phase (Phase0), the bit line BL and the complementary bit line BLB are precharged with a power supply voltage level Vdd (or an internal power voltage VINTA); in a second phase (Phase1), charge sharing by the bit line BL and capacitive coupling at the complementary bit line BLB take place; and in a third phase (Phase2), data is amplified.

In particular, when a selected word line WL is activated, and main cell 20 data is "0", a sharing of a charge $\Delta 1$ occurs between a voltage 0V stored at the main capacitor C1 and a precharged voltage Vdd at a bit line capacitor CB.

When the main cell 20 data is "1", "Vdd" corresponding to data stored in the main capacitor C1 and the voltage Vdd precharged in the bit line capacitor CB are the same, and "$\Delta 1=0V$".

Here, in the reference cell 21 connected to the complementary bit line BLB, a reference plate voltage Vpref is made to go from a reference voltage V1 (=Vdd) to a voltage V2 (for example "Vdd/2") that is less than an initial voltage V1. Therefore, the complementary bit line BLB becomes "$\Delta 2$" by means of capacitive coupling.

"$Vss<V2<Vdd$", and "$\Delta 1>\Delta 2$". Also, "$V2=Vdd/2$", and "$\Delta 1=\Delta 2/2$" such that it is easy to produce a reference voltage used for data detection.

Figure 12:
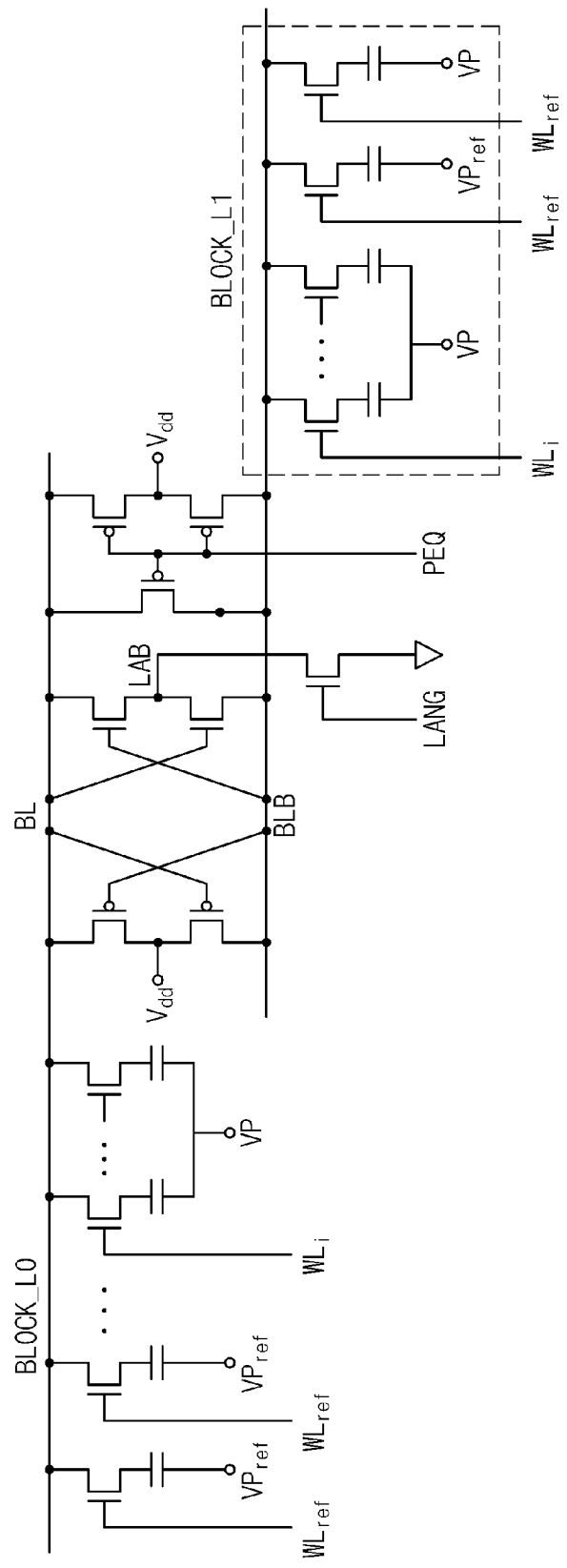
FIG. 12 is an exemplary diagram illustrating a connection between the bit line sense amplifier and memory cell blocks of FIG. 11.

FIG. 12 is an exemplary diagram illustrating a connection between the bit line sense amplifier and memory cell blocks of FIG. 11.

Referring to FIG. 12, an example is illustrated of a bit line sense amplifier connected between two memory cell blocks BLOCK_L0 and BLOCK_L1. In the circuit configuration in FIG. 12, as when the control circuit 300 and the buffer circuit 200 in FIG. 1 are additionally installed in the connected configuration in FIG. 1, leakage current flowing in an active power down mode may be minimized or reduced.

Figure 13:
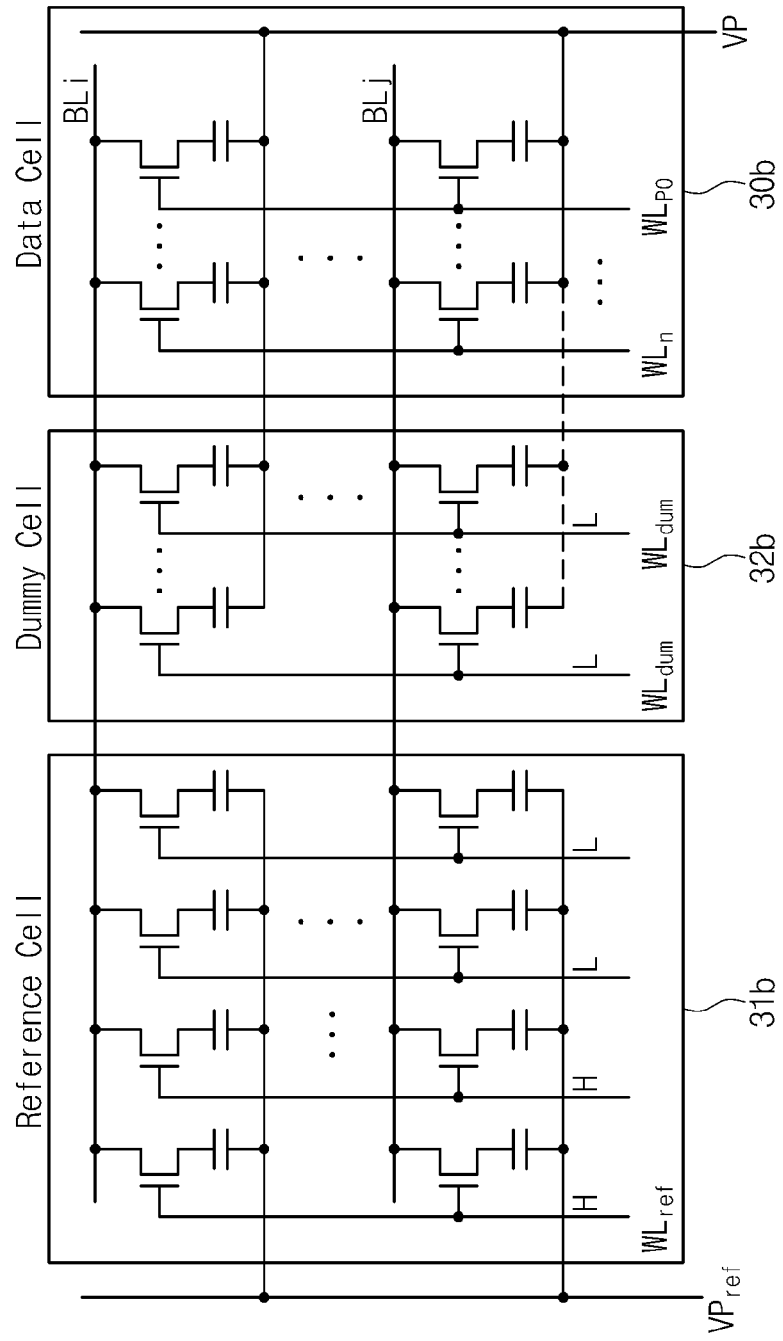
FIG. 13 is an exemplary diagram illustrating a memory cell block of FIG. 12.

The structure of each of the memory cell blocks BLOCK_L0 and BLOCK_L1 may be configured as in FIG. 13.

FIG. 13 is an exemplary diagram illustrating a memory cell block of FIG. 12.

Referring to FIG. 13, one memory cell block may include a reference cell block 31b, a dummy cell block 32b, and a data cell block 30b. The reference cell block 31b may include a plurality of reference cells, the dummy cell block 32b may include a plurality of dummy cells, and the data cell block 30b may include a plurality of main cells.

A DRAM was taken as an example in previously described embodiments. However, this is only an example. Moreover, in embodiments of the present disclosure, the configuration of a bit line may be a folded or an open configuration.

Figure 14:
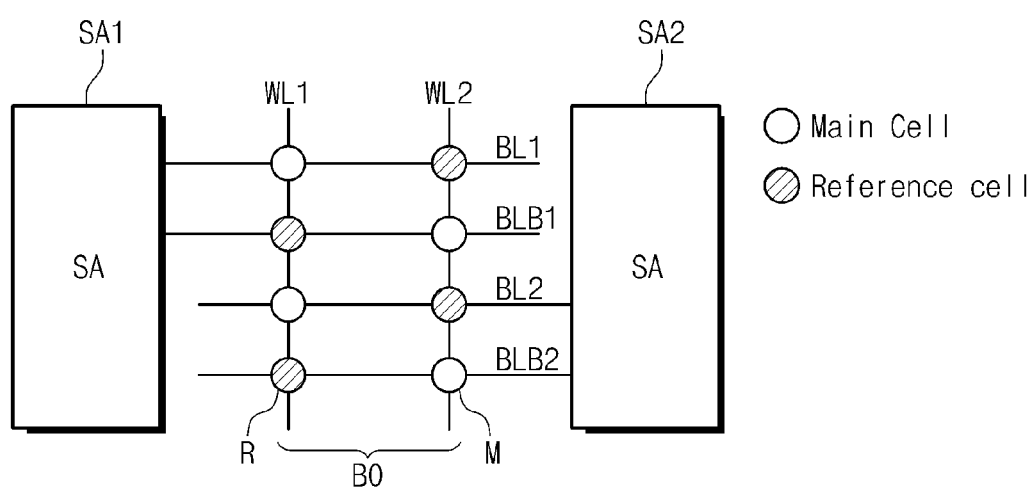
FIG. 14 is an exemplary diagram illustrating a folded bit line structure of the bit line sense amplifier of FIG. 11.

FIG. 14 is an exemplary diagram illustrating a folded bit line structure of the bit line sense amplifier of FIG. 11. Referring to FIG. 14, main cells M and reference cells R are disposed at intersecting points of word lines WL1 and WL2, bit lines BL1 and BL2, and bit lines BLB1 and BLB2, and bit line sense amplifiers SA respectively connected to pairs of bit lines are disposed adjacent to a cell block B0.

While the reference cells R may be separately controlled by separate reference word lines (not illustrated), they are exemplarily depicted here as being controlled by the same word lines WL1 and WL2 as those of the main cells M.

As illustrated, a DRAM of a folded bit line structure is a structure in which the bit lines BL1 and BL2 and the complementary bit lines BLB1 and BLB2 are disposed on the same block B0 or array, such that pairs of a bit line and a complementary bit line are all disposed in the same cell block.

Accordingly, coupling noise with the word lines WL1 and WL2 is the same for the bit lines BL1 and BL2 and the complementary bit lines BLB1 and BLB2, and the amounts of coupling through a substrate are the same. This common mode noise is removed through the differential amplification of the bit line sense amplifiers SA, and sensitivity is made high.

Figure 15:
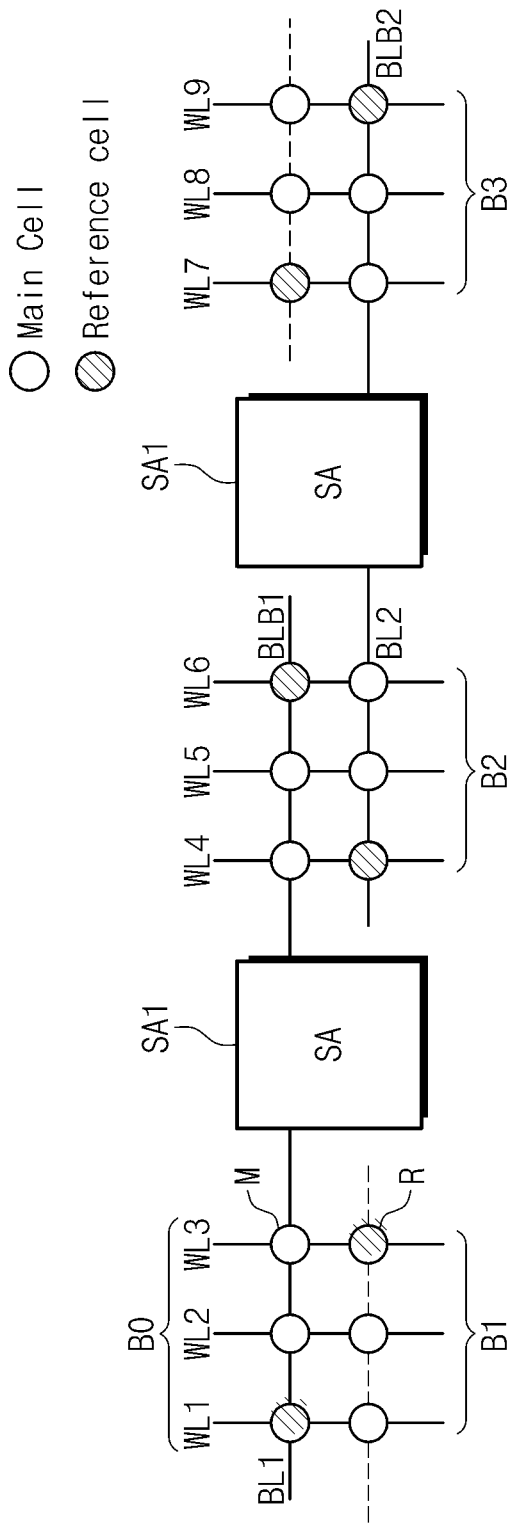
FIG. 15 is another exemplary diagram illustrating an open bit line structure of the bit line sense amplifier of FIG. 11.

FIG. 15 is another exemplary diagram illustrating an open bit line structure of the bit line sense amplifier of FIG. 11. Referring to FIG. 15, main cells M and reference cells R are disposed at intersecting points of word lines WL1 to WL9, bit lines BL1 and BL2, and bit lines BLB1 and BLB2. Bit line detecting amplifiers SA connected to respective pairs of bit lines are disposed adjacent to cell blocks B1, B2, and B3.

While an example is provided here of the reference cells R disposed at ends of each bit line pair, the reference cells R may be disposed at arbitrary positions. As illustrated, a DRAM of an open bit line configuration is a configuration in which bit lines BL1 and BL2 and complementary bit lines BLB1 and BLB2 are disposed at mutually different blocks B1 to B3, and because respective pairs of bit lines and complementary bit lines are disposed in mutually different electrical environments, a more precise design is required in order to detect and amplify small signals.

In an open bit line configuration, a main cell M is disposed at each intersecting point of word lines and bit lines. As the main cells M are disposed at all the intersecting points of the bit lines and the word lines, this may be preferable in terms of integration. While an example is provided here of the reference cells R disposed at ends of each bit line pair, the reference cells may be disposed at other positions. Further, while the reference cells R may be separately controlled by separate reference word lines (not illustrated), they are exemplarily depicted here as being controlled by the same word lines WL1, WL3, WL4, WL6, WL7, and WL9 as those of the main cells M.

Figure 16:
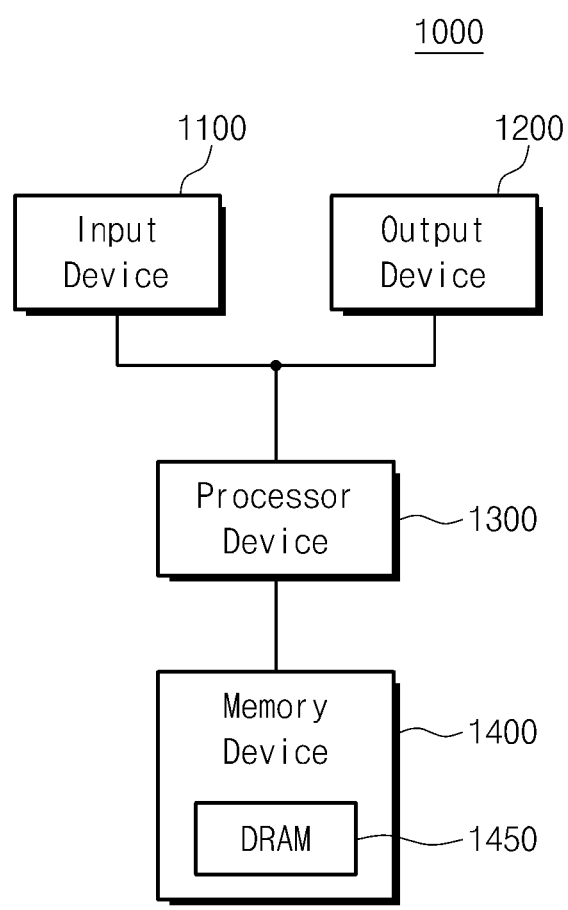
FIG. 16 is an exemplary block diagram illustrating an electronic system according to certain embodiments.

FIG. 16 is an exemplary block diagram illustrating an electronic system according to certain embodiments.

Referring to FIG. 16, an electronic system 1000 includes, for example, an input device 1100, an output device 1200, a processor device 1300, and a memory device 1400.

The memory device 1400 may include a DRAM 1450 according to disclosed embodiments. The processor device 1300 controls the input device 1100, the output device 1200, and the memory device 1400 through respectively corresponding interfaces.

Figure 17:
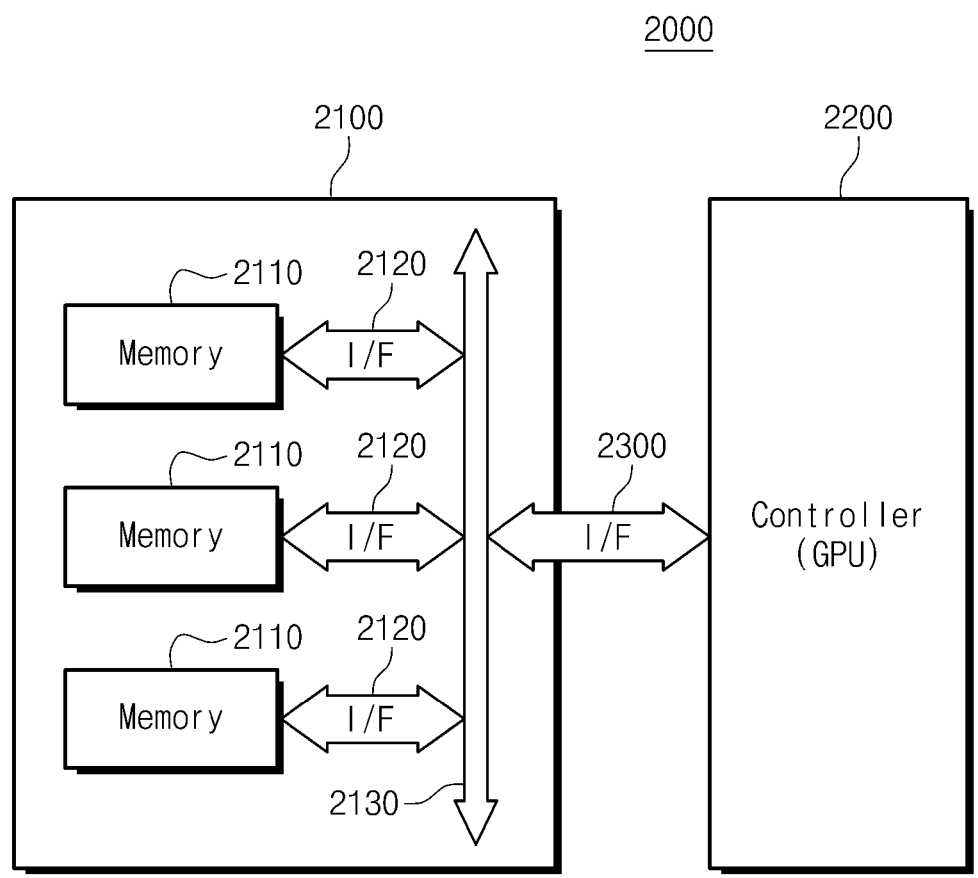
FIG. 17 is an exemplary block diagram illustrating a graphic memory system according to certain embodiments.

FIG. 17 is an exemplary block diagram illustrating a graphic memory system according to certain embodiments.

Referring to FIG. 17, a graphic memory system 2000 may include a memory group 2100 and a controller (e.g., GPU). The memory group 2100 may include a plurality of memories 2110 each including a DRAM according to disclosed embodiments, an internal interface 2130, and a memory interface 2120. The controller 2200 may control the memory group 2100 through a system bus 2300 between the memory group 2100 and the controller 2200. The plurality of memories 2110 may minimize or reduce leakage current in an active power down mode such as described above.

The controller 2200 may include a graphic engine core, and transmits and receives data to and from the memory group 2100. The above described system bus 2300, memory interface 2120, and internal interface 2130 may be integrated into one I/O or may be separated, and the data format may be partially changed autonomously through a SERDES (SERializer DESerializer) or the like according to the configuration of an application system.

Figure 18:
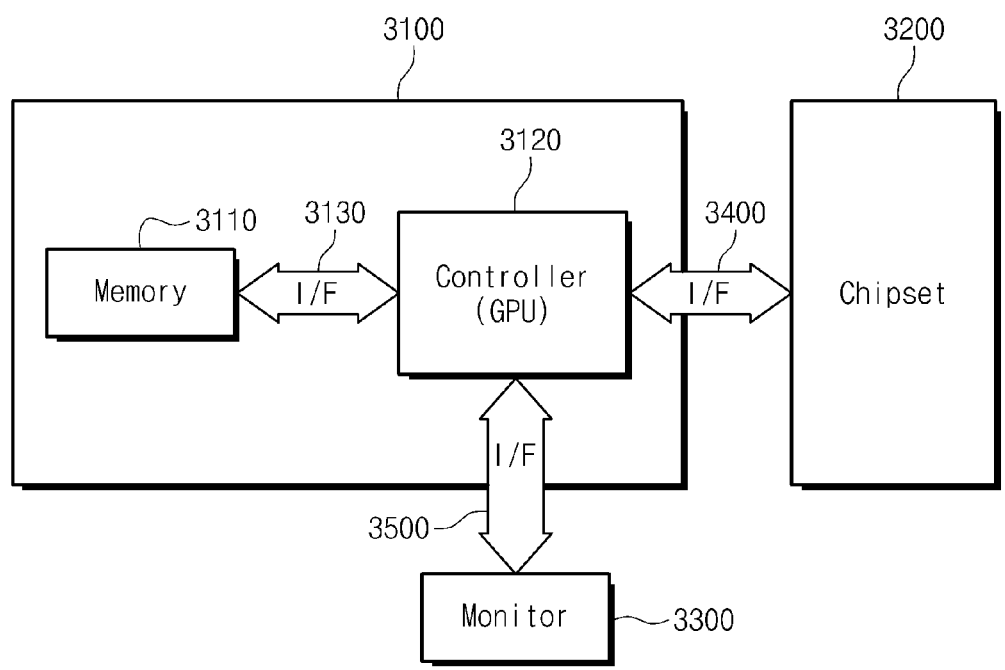
FIG. 18 is an exemplary block diagram illustrating a graphic card according to certain embodiments.

FIG. 18 is an exemplary block diagram illustrating a graphic card according to certain embodiments.

Referring to FIG. 18, a graphic card 3100 includes a memory 3110 configured as a DRAM according to disclosed embodiments, a controller 3120 (for example, a GPU) for controlling a memory 3110, and a system bus 3130 between the memory 3110 and the controller 3120. The controller 3120 transmits/receives data to/from a monitor 3300 through a first interface 3500, and the monitor receives an image and audio signal and displays these on a screen. Also, the controller 3120 transmits/receives data to/from a chipset 3200 through a second interface 3400. Here, the first and second interfaces 3500 and 3400 satisfies one of many interface protocols such as USB (Universal Serial Bus), MMC (Multi-Media Card), PCIE (Peripheral Component Interconnect-Express), SAS (Serial-attached SCSI), SATA (Serial Advanced Technology Attachment), PATA (Parallel Advanced Technology Attachment), SCSI (Small Computer System Interface), ESDI (Enhanced Small Disk Interface), and IDE (Integrated Drive Electronics).

Figure 19:
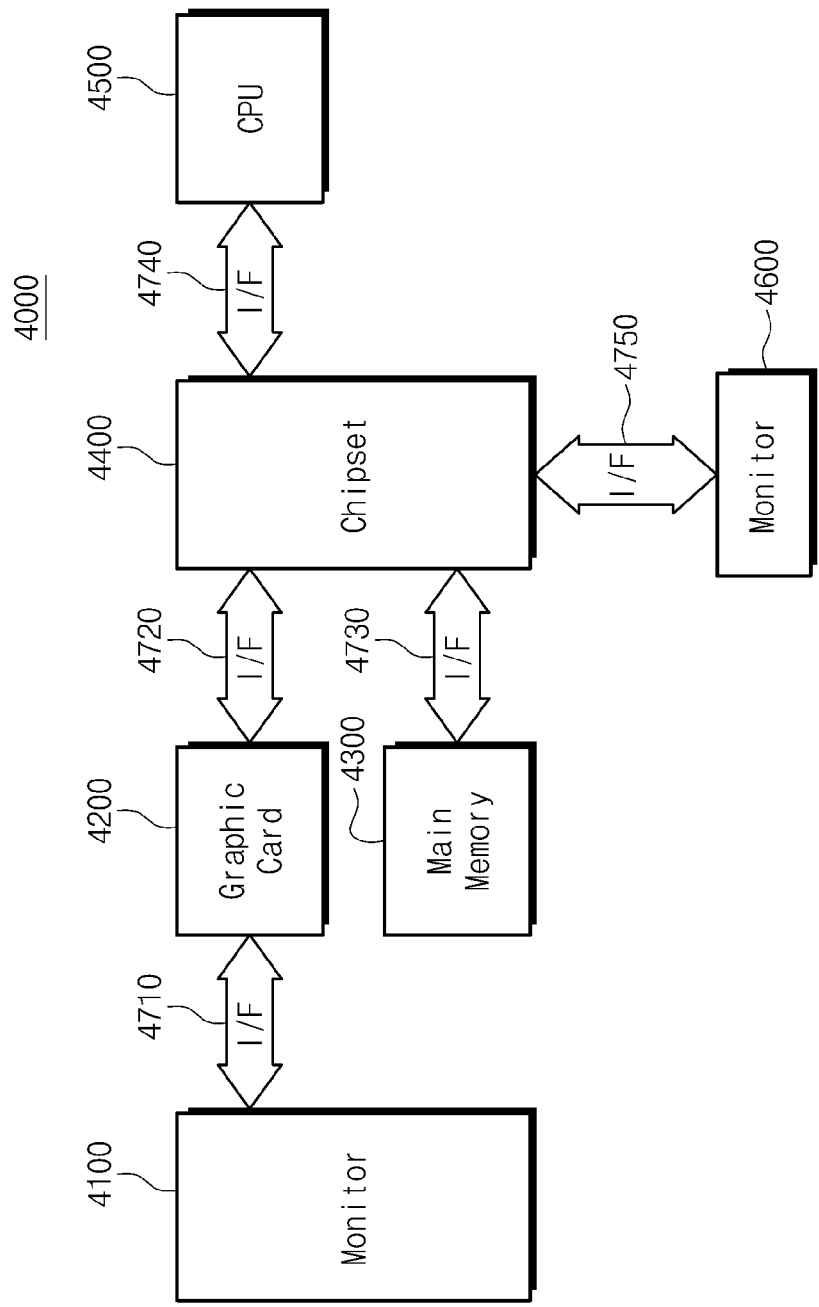
FIG. 19 is an exemplary block diagram illustrating a computing system including the graphic card in FIG. 18 according to certain embodiments.

FIG. 19 is an exemplary block diagram illustrating a computing system including the graphic card in FIG. 18 according to certain embodiments. Referring to FIG. 19, a computing system 4000 according to an embodiment of the present disclosure includes a monitor 4100, a graphic card 4200, a main memory 4300, a chipset 4400, an input/output device 4600, and a CPU 4500, which are electrically connected to system buses 4710, 4720, 4730, 4740, and 4750, respectively. The graphic card 4200 may have the configuration as described above with reference to FIG. 18, and the main memory 4300 may be mounted in the form of a module. The main memory 4300 is configured as a DRAM according to disclosed embodiments, and minimizes or reduces the power consumption of a bit line sense amplifier in an active power down mode.

In the case that the computing system according to an embodiment of the present inventive concept is a mobile device, a battery (not illustrated) is additionally provided in order to supply an operating voltage for the computing system. While not illustrated in the drawing, the computing system according to an embodiment of the present inventive concept may be further provided with an application chipset, a Camera Image Processor (CIP), a mobile DRAM, etc.

Further, a memory system or a computing system may use and have various forms of packages mounted thereon. For example, packages such as a PoP (Package on Package), BGAs (Ball grid arrays), CSPs (Chip scale packages), a PLCC (Plastic Leaded Chip Carrier), a PDIP (Plastic Dual In-Line Package), a Die in Waffle Pack, a Die in Wafer Form, a COB (Chip On Board), a CERDIP (Ceramic Dual In-Line Package), an MQFP (Plastic Metric Quad Flat Pack), a TQFP (Thin Quad Flat-Pack), an SOIC (Small Outline Integrated Circuit), an SSOP (Shrink Small Outline Package), a TSOP (Thin Small Outline Package), a TQFP (Thin Quad Flat-Pack), an SIP (System In Package), an MCP (Multi Chip Package), a WFP (Wafer-level Fabricated Package), and a WSP (Wafer-Level Processed Stack Package) may be used and mounted.

Optimal embodiments have been disclosed above through the drawings and specification. While specific terminology has been used herein, these terms have only been used for the purpose of describing embodiments of the present inventive concept, and have not been used for contextual limitation or for limiting the scope of the present inventive concept as set forth in the claims. Thus, a person having ordinary skill in the art will understand that various modifications and other equivalent embodiments will be possible from the description herein. For example, in the case of different subject matter, a method of reducing leakage current in a sense amplifier may be changed and modified in various ways without departing from the technical spirit of the present inventive concept.

The above-disclosed subject matter is to be considered illustrative and not restrictive, and the appended claims are intended to cover all such modifications, enhancements, and other embodiments, which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A semiconductor memory device, comprising:
a sense amplifier connected between a first bit line and a second bit line, and configured to amplify a voltage difference between a first bit line and a second bit line during a first operation mode of the semiconductor memory device;
a source driver connected between a source node of the sense amplifier and a sense amplifier driving signal line, and configured to provide a first voltage to the source node of the sense amplifier during the first operation mode;
a control circuit connected in parallel with the source driver between the source node of the sense amplifier and the sense amplifier driving signal line, and configured to control a voltage level of the sense amplifier driving signal line in response to a voltage level of the source node of the sense amplifier during a second operation mode of the semiconductor memory device different from the first operation mode; and
a buffer circuit configured to float the sense amplifier driving signal line during the second operation mode of the semiconductor memory device.

2. The semiconductor memory device of claim 1, wherein the source driver is an n-type MOS (NMOS) transistor.

3. The semiconductor memory device of claim 1, wherein the second operation mode is an active power down mode.

4. The semiconductor memory device of claim 1, wherein the buffer circuit is a tri-state buffer configured to apply a sense amplifier enable signal to the sense amplifier driving signal line during the first operation mode.

5. A method of operating a semiconductor memory device having a sense amplifier connected to a first bit line and a second bit line, and a source driver connected to a source node of the sense amplifier, the method comprising:
   activating a buffer circuit to provide a first driver control signal having a first voltage level to the source driver from an output node of the buffer circuit;
   activating the source driver in response to the first driver control signal, such that the sense amplifier is activated; and
   floating the output node of the buffer circuit and providing a second driver control signal having a second voltage level different from the first voltage level to the output node of the buffer circuit,
   wherein the second voltage level of the second driver control signal is responsive to a voltage level of the source node of the sense amplifier.

6. The method of claim 5, wherein activating the buffer circuit and the source driver occurs during a first operation mode of the semiconductor memory device, and
   wherein floating the output node of the buffer circuit occurs during a second operation mode of the semiconductor memory device different from the first operation mode.

7. The method of claim 6, wherein providing the second voltage includes turning on a switch circuit to electrically connect the source node of the sense amplifier to the output node of the buffer circuit.

8. The method of claim 6, wherein providing the second voltage includes:
   activating an amplifier having a first input terminal connected to the source node of the sense amplifier, a second input terminal connected to a reference voltage, and an output terminal;
   turning on a first switch to electrically connect the source node of the sense amplifier to the first input terminal of the amplifier; and
   turning on a second switch to electrically connect the output node of the buffer circuit to the output terminal of the amplifier.

9. The method of claim 8, further comprising:
   when the second operation mode is entered maintaining the source node of the sense amplifier at a voltage level of the reference voltage.

10. A circuit for controlling a sense amplifier source node of a semiconductor memory device, the circuit comprising:
   a source driver connected between a source node of a sense amplifier and a sense amplifier driving signal line, for driving the source node of the sense amplifier to a set voltage level;
   a floating circuit for floating the sense amplifier driving signal line in a set operating mode; and
   a controller connected in parallel with the source driver between the source node of the sense amplifier and the sense amplifier driving signal line, for controlling a level of the sense amplifier driving signal line in the set operating mode.

11. The circuit of claim 10, wherein the controller comprises:
   a voltage level amplifying circuit having a first input terminal, and a second input terminal to which a reference voltage is applied;
   a first switch for switching between the first input terminal and the source node of the sense amplifier in the set operating mode; and
   a second switch for switching between an output terminal of the voltage level amplifying circuit and the sense amplifier driving signal line in the set operating mode.

12. The circuit of claim 11, wherein the first and second switches are MOS transistors that are switched "on" in the set operating mode and switched "off" in an operating mode other than the set operating mode.

13. The circuit of claim 11, wherein the voltage level amplifying circuit comprises a differential amplifier for driving the source node of the sense amplifier to a level of the reference voltage in the set operating mode.

14. The circuit of claim 13, wherein the voltage level amplifying circuit is shared by one or more memory banks of the semiconductor memory device.

15. The circuit of claim 13, further comprising an amplifying circuit connected between the voltage level amplifying circuit and the source node of the sense amplifier, for driving the source node of the sense amplifier at a level of the reference voltage or higher.

16. The circuit of claim 10, wherein the sense amplifier is a bit line sense amplifier including n-type MOS (NMOS) transistors.

17. The circuit of claim 10, wherein the set operating mode is an operating mode other than an active mode of the semiconductor memory device.

18. The circuit of claim 10, wherein the source driver comprises at least one NMOS transistor of which a drain is connected to the source node of the sense amplifier, a gate is connected to the sense amplifier driving signal line, and a source is connected to ground.

19. The circuit of claim 10, wherein the floating circuit is a tri-state buffer for applying a sense amplifier enable signal to the sense amplifier driving signal line in an active mode of the semiconductor memory device.

* * * * *